United States Patent
Kato

(10) Patent No.: US 7,113,378 B2
(45) Date of Patent: Sep. 26, 2006

(54) ESD BREAKDOWN PREVENTION PROTECTION CIRCUIT

(75) Inventor: Katsuhiro Kato, Tokyo (JP)

(73) Assignee: Oki Electric Industry Co., LTD, Tokyo (JP)

(*) Notice: Subject to any disclaimer, the term of this patent is extended or adjusted under 35 U.S.C. 154(b) by 173 days.

(21) Appl. No.: 10/747,234

(22) Filed: Dec. 30, 2003

(65) Prior Publication Data

US 2005/0078420 A1    Apr. 14, 2005

(30) Foreign Application Priority Data

Oct. 8, 2003  (JP) .............................. 2003-349871

(51) Int. Cl.
- H02H 9/00   (2006.01)
- H02H 3/20   (2006.01)
- H02H 9/04   (2006.01)
- H02H 3/22   (2006.01)

(52) U.S. Cl. .................. 361/56; 361/111; 361/91.1

(58) Field of Classification Search ................ 361/56, 361/91.1, 111

See application file for complete search history.

(56) References Cited

U.S. PATENT DOCUMENTS 6,507,469 B1 * 1/2003 Andoh .................. 361/56

FOREIGN PATENT DOCUMENTS

| JP | 06-104721 | 4/1994 |
|---|---|---|
| JP | 06-310715 | 11/1994 |
| JP | 06-334443 | 12/1994 |
| JP | 2001-358297 | 12/2001 |
| JP | 2003-60058 | 2/2003 |

* cited by examiner

Primary Examiner—Stephen W. Jackson
Assistant Examiner—Dharti H. Patel
(74) Attorney, Agent, or Firm—Rabin & Berdo P.C.

(57) ABSTRACT

A semiconductor device of the invention prevents a breakdown of a gate oxide film, while restraining an area of a protection circuit to enlarge, without substantially involving a modification of a manufacturing process. The semiconductor device includes an electrostatic breakdown preventing protection circuit made up of an input line electrically connecting an input terminal to an input circuit, a first power supply line connected to a first power supply terminal, a first MOSFET, and a first protection circuit. A drain electrode of the first MOSFET is connected to the input line, a source electrode and a substrate electrode thereof are connected to the first power supply line, and the gate electrode thereof is connected to a voltage control circuit. The voltage control circuit is connected to bridge the input line and the power supply line. The voltage control circuit controls the potential of the gate electrode of the first MOSFET to a potential between the potential of the drain electrode and the potential of the source electrode so that the protection circuit prevents a breakdown of the gate oxide film by an electrostatic surge.

6 Claims, 10 Drawing Sheets

SEMICONDUCTOR DEVICE ACCORDING TO THE FIRST EMBODIMENT

SEMICONDUCTOR DEVICE ACCORDING TO THE FIRST EMBODIMENT

CIRCUIT FOR MEASURING VOLTAGE
ACCORDING TO THE FIRST EMBODIMENT

RELATION BETWEEN DRAIN VOLTAGE (V1) AND VOLTAGE
ACROSS DRAIN-GATE (V2) ACCORDING TO THE FIRST EMBODIMENT

SEMICONDUCTOR DEVICE
ACCORDING TO THE SECOND EMBODIMENT

CIRCUIT FOR MEASURING VOLTAGE
ACCORDING TO THE SECOND EMBODIMENT

RELATION BETWEEN DRAIN VOLTAGE (V11) AND VOLTAGE ACROSS DRAIN-GATE (V12) ACCORDING TO THE SECOND EMBODIMENT

CONVENTIONAL SEMICONDUCTOR DEVICE

CIRCUIT FOR MEASURING
CURRENT VS. VOLTAGE CHARACTERISTIC

RELATION BETWEEN DRAIN VOLTAGE $V_D$ AND DRAIN CURRENT $I_D$

RELATION BETWEEN DRAIN VOLTAGE AND
DRAIN CURRENT OF NMOS ACCORDING TO HIGH VOLTAGE PROCESS

ESD BREAKDOWN PREVENTION PROTECTION CIRCUIT

BACKGROUND OF THE INVENTION

1. Field of the Invention

The present invention relates to a semiconductor device provided with a protection circuit for preventing electrostatic breakdown, specifically to the protection circuit for preventing electrostatic breakdown.

2. Description of the Related Art

Many semiconductor integrated circuit devices (hereunder, referred to structure as Metal, Oxide film, and Semiconductor, namely, the MOS structure. The MOS filed effect transistor (MOSFET) adopting the MOS structure uses a silicon oxide film (also referred to as the gate oxide film) in the insulating film to separate the gate and the channel.

When a semiconductor device is connected to, for example, an external circuit, there is an apprehension that a circuit inside the semiconductor device is subject to an electrostatic charged with the external circuit to fall into an electrostatic breakdown. In order to prevent the electrostatic breakdown, the input terminal or output terminal of the semiconductor device is provided with a protection circuit for preventing the electrostatic breakdown (hereunder, referred to as electrostatic breakdown preventing protection circuit).

The conventional electrostatic breakdown preventing protection circuit provided at the input terminal or output terminal of the semiconductor device generally uses N-type transistors. Here, the N-type transistors each are located between the input terminal and a power supply terminal, and between the input terminal and a grounding terminal. When a positive voltage is applied to the input terminal as an electrostatic, by the breakdown of the N-type transistors each, and when a negative voltage is applied as an electrostatic, by the N-type transistors each being brought into a conductive state, namely, being turned ON, the electrostatic is discharged to the power supply terminal or the grounding terminal (refer to the patent document 1).

Some protection circuits are provided with the input circuit using complementary MOSFETs (hereunder, referred to as CMOS). A conventional example of the input circuit using the CMOS will be explained with reference to FIG. 7 through FIG. 9.

FIG. 7 illustrates a conventional electrostatic breakdown preventing protection circuit. An input terminal 221 is electrically connected to an input circuit 229 being a protective object, by way of an input line 211 furnished with an input protection resistor 227. Here, an inverter is used as the input circuit 229. A power supply line 213 is connected to a power supply terminal 223, and a grounding line 215 is connected to a grounding terminal 225. Between the input line 211 and the power supply line 213 is located a P-type MOSFET (hereunder, referred to as PMOS) 251; and between the input line 211 and the grounding line 215 is located an N-type MOSFET (hereunder, referred to as NMOS) 261. Here, it is assumed that with regard to the NMOS 261, N-type source and drain are formed on a P-type substrate, and with regard to the PMOS 251, an N-type well is formed on the P-type substrate, and P-type source and drain are formed on the N-type well.

A source electrode 253, a gate electrode 257, and a well electrode 259 of the PMOS 251 are connected to the power supply line 213. A drain electrode 255 of the PMOS 251 is connected to the input line 211.

A source electrode 263, a gate electrode 267, and a substrate electrode 269 of the NMOS 261 are connected to the grounding line 215. A drain electrode 265 of the NMOS 261 is connected to the input line 211.

FIG. 8 is a circuit diagram for explaining a measuring circuit of the current vs. voltage characteristic of the NMOS 261. An output terminal of a variable voltage supply 271 is connected to the drain electrode 265 of the NMOS 261 through an ammeter 281. A grounding terminal of the variable voltage supply 271 is connected to the source electrode 263, the gate electrode 267, and the substrate electrode 269 of the NMOS 261, and also to the grounding terminal 225. A voltmeter 283 is connected to measure a voltage across the source electrode 263-drain electrode 265. Hereunder, the current measured by the ammeter 281 is referred to as a drain current $I_D$, and the voltage measured by the voltmeter 283 is referred to as a drain voltage $V_D$.

FIG. 9 typically illustrates a relation between the drain voltage $V_D$ and the drain current $I_D$, by the circuit explained with reference to FIG. 8. The horizontal axis represents the drain voltage $V_D$, and the vertical axis represents the drain current $I_D$.

The output voltage of the variable voltage supply 271, namely, the drain voltage $V_D$ increases from the state of 0 Volt. Since the source electrode 263, gate electrode 267, and substrate electrode 269 of the NMOS 261 are grounded, and a potential difference is not given across the gate-source, the NMOS 261 is always OFF. As the drain voltage $V_D$ increases, a reverse voltage is applied to a diode formed across the drain-silicon substrate, and the drain current $I_D$ does not flow. However, as the drain voltage $V_D$ increases further to exceed a breakdown voltage $V_{BD}$ of the PN junction existing across the drain-silicon substrate, a current starts flowing from the drain to the substrate. This current is divided into a breakdown current flowing through the diode and a base current flowing into the emitter-base of a parasitic bipolar transistor existing in the NMOS 261. As the drain voltage $V_D$ increases further more, the breakdown current and the base current increase. At the time when the base current increases and the potential of the substrate rises higher by a forward voltage $V_F$ (about 0.6 V in case of the silicon semiconductor) of the PN junction than the potential of the source, a forward current flows into the substrate-source, accordingly the parasitic bipolar transistor of the NMOS 261 is turned ON. The drain voltage at this moment is referred to as a turn-on voltage $V_{TO}$.

As the parasitic bipolar transistor is turned ON, a through current flows into the collector-emitter of the bipolar transistor, namely, into the drain-source of the NMOS 261; accordingly, the drain voltage sharply falls. To utilize this behavior of the parasitic bipolar transistor for protecting the device against the electrostatic is the main current of the protection circuit design at the present time.

Since the gate electrode and the source electrode of the NMOS 261 are on the same potential, when the parasitic bipolar transistor is turned ON, the turn-on voltage $V_{TO}$ is applied across the drain-gate, namely, to the gate oxide film. Generally, the turn-on voltage $V_{TO}$ of the parasitic bipolar transistor is set lower than a gate oxide film breakdown voltage $V_C$.

[Patent Document 1] JPA-No.Hei9-284119 (paragraph 0007~0013)

SUMMARY OF THE INVENTION

However, accompanied with the trend toward the fine structure and high integration of the semiconductor device, the gate oxide film becomes increasingly thinner. Accordingly, the difference between the gate oxide film breakdown voltage $V_C$ and the turn-on voltage $V_{TO}$ of the parasitic bipolar transistor is reduced. In case of the semiconductor device conforming to the high voltage process such that the specification voltage exceeds 20 Volts, there has occurred an inversion that the turn-on voltage $V_{TO}$ of the parasitic bipolar transistor becomes higher than the gate oxide film breakdown voltage $V_C$.

The present invention has been made in view of the aforementioned problems, and an object of the invention is to provide an electrostatic breakdown preventing protection circuit for the semiconductor device, capable of preventing a breakdown of the gate oxide film, while restraining the area of the protection circuit to enlarge, without substantially involving a modification of the manufacturing process.

In order to accomplish the above object, the semiconductor device of the invention includes a circuit to be protected, and an electrostatic breakdown preventing protection circuit that prevents an electrostatic breakdown of the circuit to be protected. The electrostatic breakdown preventing protection circuit includes an input terminal, a first power supply terminal, a first MOSFET, and a voltage control circuit. The input terminal connects an external circuit to the circuit to be protected. The first MOSFET has the drain electrode connected to the input terminal and the circuit to be protected, and has the source and substrate electrodes connected to the first power supply terminal. The voltage control circuit is connected to bridge the drain electrode and the source electrode of the first MOSFET, and controls a voltage of the gate electrode of the first MOSFET to prevent an electrostatic breakdown of the first MOSFET.

According to the embodiment of the semiconductor device of the invention, it is preferable that the voltage control circuit is formed with a series circuit of a first protection element and a second protection element for dividing the voltage across the drain-source of the first MOSFET, and a node connecting the first and second protection elements is connected to the gate electrode of the first MOSFET.

It is also preferable that the first MOSFET is a P-type MOSFET, the first protection element is a P-type MOSFET, the second protection element is a resistor, the drain electrode of the first protection element is connected to the drain electrode of the first MOSFET, and the source electrode, gate electrode, and substrate electrode of the first protection element are connected to the gate electrode of the first MOSFET.

The first MOSFET and the first protection element may be an N-type MOSFET.

Further, the semiconductor device of the invention includes a second power supply terminal, and it is preferable that the first MOSFET is an N-type MOSFET, the first protection element is a P-type MOSFET, the second protection element is a resistor, the drain electrode of the first protection element is connected to the drain electrode of the first MOSFET, the source electrode of the first protection element is connected to the gate electrode of the first MOSFET, and the gate electrode and substrate electrode of the first protection element are connected to the second power supply terminal through the resistor.

Further, the semiconductor device of the invention includes a second power supply terminal, and it is preferable that the first MOSFET is an N-type MOSFET, the first protection element is a P-type MOSFET, the second protection element is a resistor, the drain electrode of the first protection element is connected to the drain electrode of the first MOSFET, the source electrode of the first protection element is connected to the gate electrode of the first MOSFET, and the gate electrode and well electrode of the first protection element are connected to the second power supply terminal through the resistor.

In the semiconductor device of the invention, the voltage control circuit controls the potential of the gate electrode of the first MOSFET to a potential between the potential of the drain electrode and the potential of the source electrode. Therefore, setting the voltage across the drain-gate and the voltage across the gate-source lower than the voltage across the drain-source makes it possible to suppress the potential of the gate electrode of the first MOSFET lower than the gate oxide film breakdown voltage, even if the turn-on voltage of the first MOSFET is high.

In the semiconductor device of the invention, the voltage control circuit is configured with only two elements of the first protection element and the second protection element, which are connected in series, and it can be manufactured with a simple process.

When using a P-type MOSFET as the first MOSFET and a P-type MOSFET as the first protection element, the protection circuit only uses the MOSFETs and resistors of the same structure as generally used; accordingly, it does not involve any additions to the manufacturing process. Since the voltage control circuit can be designed in a very small area, there arises a slight increase in the occupancy area of the electrostatic breakdown preventing protection circuit. And, since the voltage control circuit is added to the P-type MOSFET, it becomes possible not to create a breakdown of the gate oxide film against a negative electrostatic surge that is likely to create a breakdown of the gate oxide film.

When using an N-type MOSFET as the first MOSFET and an N-type MOSFET as the first protection element, the protection circuit only uses the MOSFETs and resistors of the same structure as conventionally used; accordingly, it does not involve any additions to the manufacturing process. Since the voltage control circuit can be designed in a very small area, there arises a slight increase in the occupancy area of the electrostatic breakdown preventing protection circuit. And, since the voltage control circuit is added to the N-type MOSFET, it becomes possible not to create a breakdown of the gate oxide film against a positive electrostatic surge that is likely to create a breakdown of the gate oxide film.

Since the PMOS is employed as the first protection element, in relation to the first MOSFET of an N-type MOSFET, the protection circuit is effective when the sum of the forward voltage of the PN junction of the PMOS for protection and the breakdown voltage of the PMOS for protection is lower than the breakdown voltage of the NMOS. That is, since the PMOS for protection on the protecting side against an electrostatic surge is designed to operate at a lower voltage than the N-type MOSFET on the protected side, the protection circuit is able to protect the gate oxide film more securely.

When a CMOS is formed with an N-type MOSFET of the first MOSFET and a P-type MOSFET of the first protection element, the above protection circuit can be formed with the same process as the conventional.

DETAILED DESCRIPTION OF THE PREFERRED EMBODIMENTS

The embodiments of the invention will be described with reference to the accompanying drawings, however the construction and arrangement are only illustrative examples for a quickly understanding of the invention. The preferred constructions of the invention will now be described, however the numerical conditions and so forth of the constructions are only preferred examples. Therefore, the invention will not be restricted to the following embodiments.

(Construction of the First Embodiment)

Figure 1:
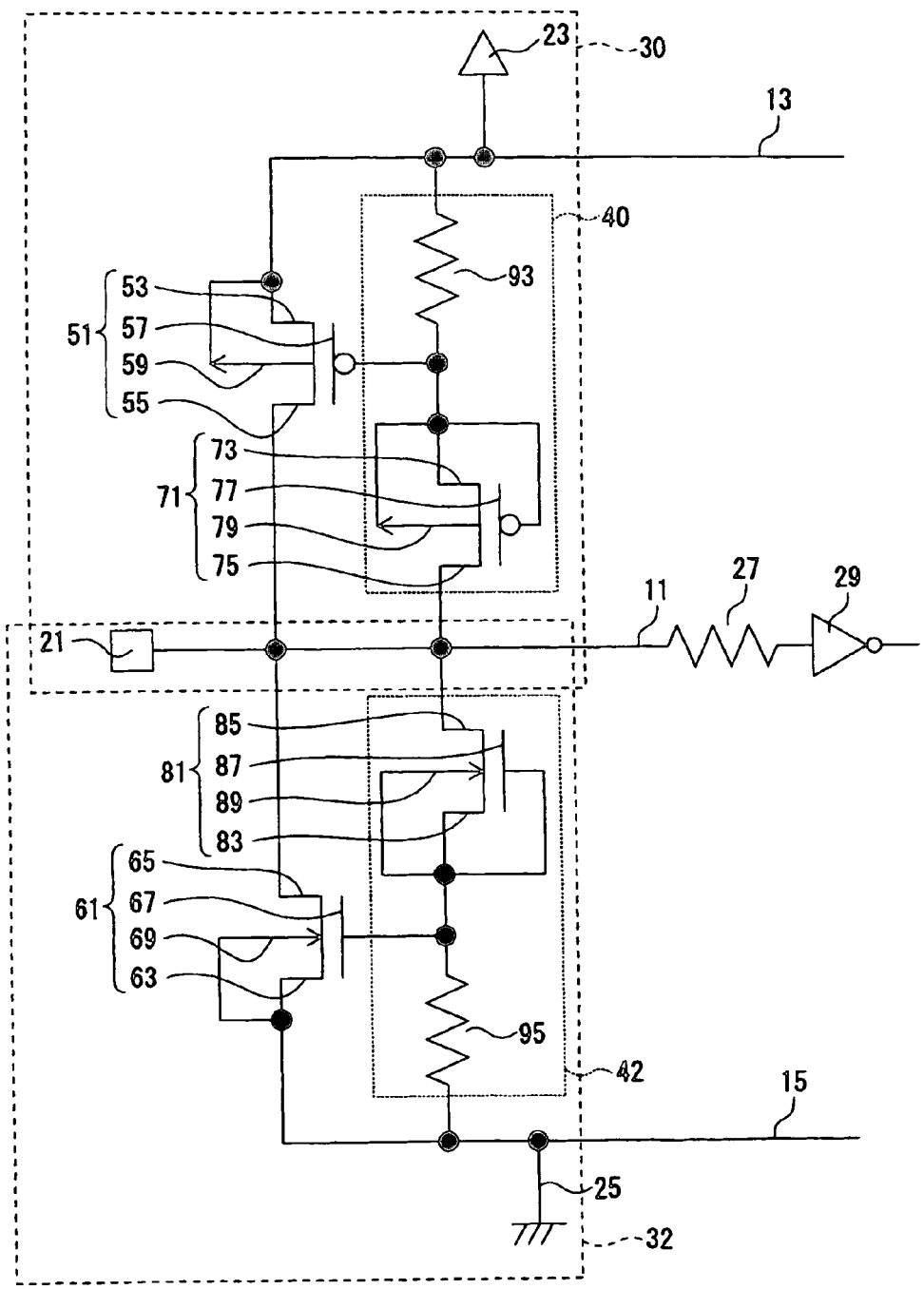
FIG. 1 illustrates a semiconductor device of the first embodiment.

The semiconductor device of the first embodiment provided with the electrostatic breakdown preventing protection circuit of the invention will be described with reference to FIG. 1. FIG. 1 is a circuit diagram illustrating the semiconductor device of the first embodiment.

An input terminal 21 is electrically connected to an input circuit 29 being a circuit to be protected, by way of an input line 11 furnished with an input protection resistor 27. Here, an inverter is used as the input circuit 29. A power supply line 13 is connected to a power supply terminal 23, and a grounding line 15 is connected to a grounding terminal 25.

This semiconductor device includes two electrostatic breakdown preventing protection circuit, namely, a first electrostatic breakdown preventing protection circuit 30 made up of the input terminal 21 and the power supply terminal 23 as the first power supply terminal, and a second electrostatic breakdown preventing protection circuit 32 made up of the input terminal 21 and the grounding terminal 25 as the first power supply terminal.

Here, the input protection resistor 27 and the input circuit 29 can be realized with well-known resistor elements and circuit constructions, and the description thereof will be omitted.

Here, it is assumed that an N-type MOSFET is formed with an N-type source and drain being formed on a P-type substrate, and a P-type MOSFET is formed with an N-type well being formed on the P-type substrate, and a P-type source and drain being formed on the N-type well.

The first electrostatic breakdown preventing protection circuit 30 includes a first MOSFET and a voltage control circuit 40. Between the input line 11 and the power supply line 13 is located a P-type MOSFET (hereunder, referred to as PMOS) 51 as the first MOSFET. A drain electrode 55 of the PMOS 51 is connected to the input line 11. A source electrode 53 and a well electrode 59 of the PMOS 51 are connected to the power supply line 13. In order to protect the gate oxide film of the PMOS 51 from an electrostatic breakdown, the voltage control circuit 40 for controlling the potential of a gate electrode 57 of the PMOS 51 is inserted between the input line 11 and the power supply line 13. The voltage control circuit 40 is connected to bridge the drain and source of the PMOS 51, and is formed with the series connection of a first protection element and a second protection element. The gate electrode 57 of the PMOS 51 is connected to a node connecting the first protection element and the second protection element. Thereby, the gate electrode 57 of the PMOS 51 is given a potential divided by the ratio of the resistive components of the first protection element and the second protection element. Here, as the first protection element is used a PMOS 71 for protection, and as the second protection element is used a resistor 93.

The gate electrode 57 of the PMOS 51 is connected to the power supply line 13 through the resistor 93. A drain electrode 75 of the PMOS 71 for protection is connected to the input line 11. A source electrode 73, a gate electrode 77, and a well electrode 79 of the PMOS 71 for protection are connected to the gate electrode 57 of the PMOS 51.

The second electrostatic breakdown preventing protection circuit 32 includes the first MOSFET and a voltage control circuit 42. Between the input line 11 and the grounding line 15 is located an N-type MOSFET (hereunder, referred to as NMOS) 61 as the first MOSFET. A drain electrode 65 of the NMOS 61 is connected to the input line 11. A source electrode 63 and a substrate electrode 69 of the NMOS 61 are connected to the grounding line 15. In order to protect the gate oxide film of the NMOS 61 from an electrostatic breakdown, the voltage control circuit 42 for controlling the potential of a gate electrode 67 of the NMOS 61 is inserted between the input line 11 and the grounding line 15. The voltage control circuit 42 is connected to bridge the drain and source of the NMOS 61, and is formed with the series connection of a first protection element and a second protection element. The gate electrode 67 of the NMOS 61 is connected to a node connecting the first protection element and the second protection element. Thereby, as the potential of the gate electrode 67 of the NMOS 61 is given a potential divided by the ratio of the resistive components of the first protection element and the second protection element. Here, as the first protection element is used an NMOS 81 for protection, and as the second protection element is used a resistor 95.

The gate electrode 67 of the NMOS 61 is connected to the grounding line 15 through the resistor 95. A drain electrode 85 of the NMOS 81 for protection is connected to the input line 11. A source electrode 83, a gate electrode 87, and a substrate electrode 89 of the NMOS 81 for protection are connected to the gate electrode 67 of the NMOS 61.

Although the MOSFET is used as the first protection element, and the resistive element is used as the second protection element in this case, the first MOSFET may be combined with an element capable of giving a voltage corresponding to a setting. Since the first protection element is needed to be OFF to the voltage of the normal signal level, it can be realized by a diode, for example. Since the second protection element only needs to give a resistance, the resistance of a FET being forced to always be ON, for example, may be used.

(Operation of the First Embodiment)

The operation of the first embodiment will be described with reference to FIG. 2 and FIG. 3.

Figure 2:
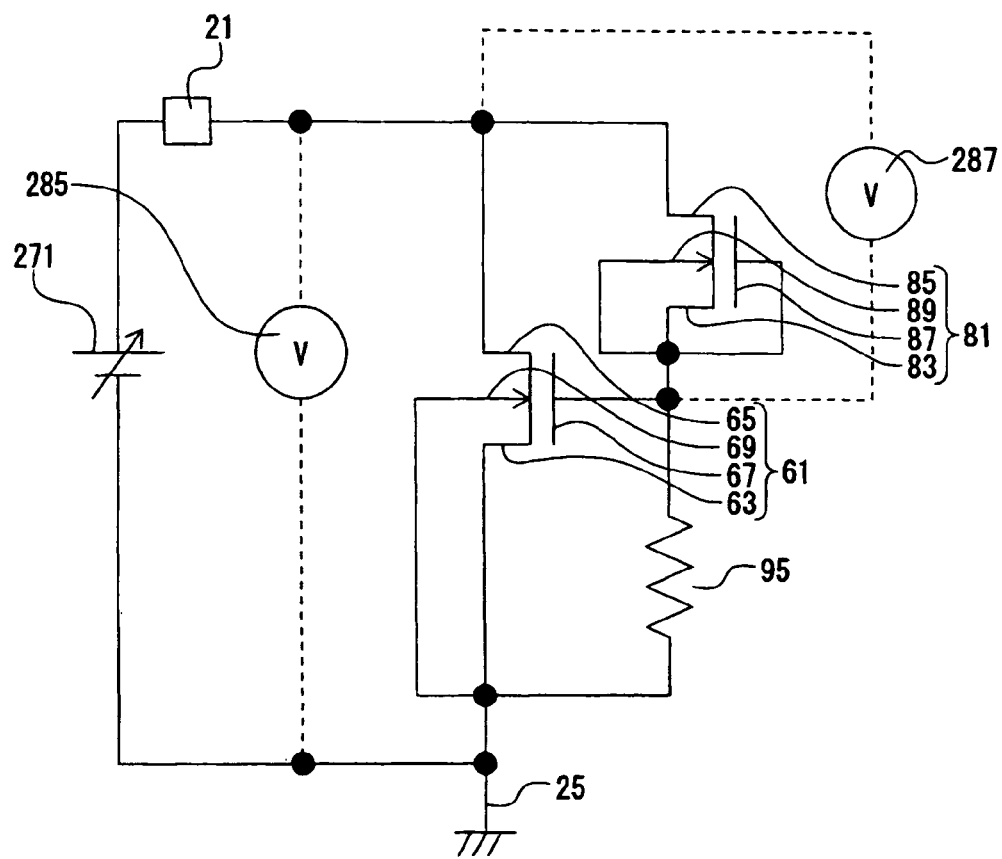
FIG. 2 illustrates a circuit for measuring the characteristic of the semiconductor device of the first embodiment.

FIG. 2 is a circuit diagram explaining a circuit for measuring the characteristic of the second electrostatic breakdown preventing protection circuit 32. A variable voltage supply 271 is provided to bridge the input terminal 21 and the grounding terminal 25, thus applying a voltage to the input terminal 21. Here, a first voltmeter 285 measures a voltage across the drain-source (hereunder, referred to as drain voltage) V1 of the NMOS 61, and a second voltmeter 287 measures a voltage across the drain-gate V2 of the NMOS 61.

Figure 3:
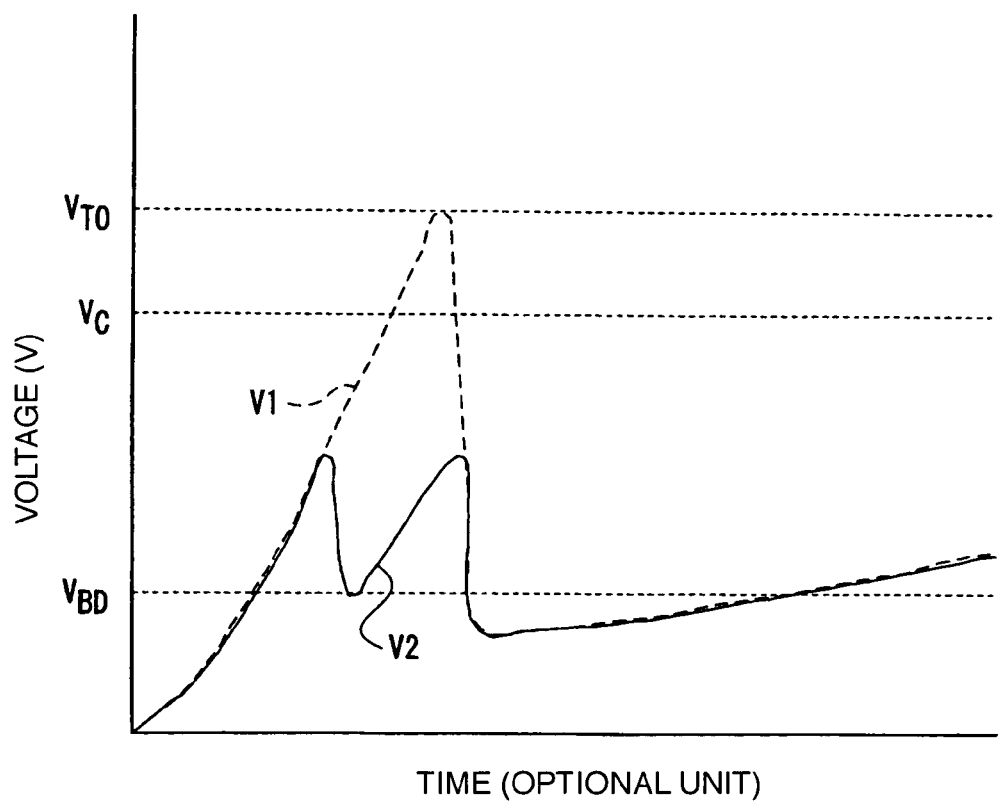
FIG. 3 illustrates a relation between the drain voltage and the voltage across the drain-gate of the first embodiment.

FIG. 3 illustrates a variation of the drain voltage V1 and the voltage across the drain-gate V2 of the NMOS 61, by the circuit explained with reference to FIG. 2. The horizontal axis represents the time, and the vertical axis represents the voltage.

As the output voltage of the variable voltage supply 271 gradually increases from the state of 0 Volt, the drain voltage V1 and the voltage across the drain-gate V2 each increase. Here, since both the NMOS 61 and the NMOS 81 for protection are OFF, the drain voltage V1 is equal to the voltage across the drain-gate V2. Thereafter, at the moment that the drain voltage V1 reaches a breakdown voltage $V_{BD}$ of the PN junction across the drain-substrate of the NMOS 61, a breakdown is created across the drain-substrate of the NMOS 61 to flow a breakdown current.

Further, since the voltage across the drain-gate V2 of the NMOS 61 corresponds to the voltage across the drain-substrate of the NMOS 81 for protection, the PN junction across the drain-substrate of the NMOS 81 for protection also creates a breakdown to flow a breakdown current. The breakdown current flowing through the NMOS 81 for protection flows through the resistor 95 into the grounding terminal 25.

As the breakdown current flows through the NMOS 81 for protection and the resistor 95, there occurs a potential difference between both ends of the resistor 95; accordingly, the voltage across the drain-gate V2 of the NMOS 61 becomes lower by the potential difference than the drain voltage V1. As the voltage across the drain-gate V2 becomes equal to or lower than the breakdown voltage $V_{BD}$, the breakdown current stops flowing. In this manner, the PN junction across the drain-substrate of the NMOS 81 for protection becomes conductive intermittently, however as a whole, the voltage across the drain-gate V2 increases, bearing the same value as the drain voltage V1. Even if there occurs a voltage drop by the breakdown current flowing through the NMOS 81 for protection and the resistor 95, as the drain voltage V1 and the voltage across the drain-gate V2 reach a voltage just to maintain V2>$V_{BD}$, the breakdown current flows through the NMOS 81 for protection steadily. Here, if the effective resistance of the NMOS 81 for protection is represented by R1(=ΔV/ΔI), and the resistance of the resistor 95 is represented by R2, the voltage across the drain-gate V2 of the NMOS 61 is given as follows.

$$V2=V1 \cdot R1/(R1+R2)$$

Hereafter, the voltage across the drain-gate V2 of the NMOS 61 is suppressed to a voltage determined by the ratio of the resistances R1 and R2. As the drain voltage V1 further rises to reach the turn-on voltage $V_{TO}$ of the bipolar transistor being parasitic on the NMOS 61, a through current flows into the drain-source of the NMOS 61 (collector-emitter of the parasitic bipolar transistor), and the drain voltage V1 sharply drops. The voltage across the drain-gate V2 of the NMOS 61 drops to follow the drain voltage V1.

Practically, the ratio of the resistances R1 and R2 is determined by the three values of the breakdown voltage $V_{BD}$, the gate oxide film breakdown voltage $V_C$, and the turn-on voltage $V_{TO}$ of the bipolar transistor being parasitic on the NMOS 61. In order to prevent a breakdown of the gate oxide film, it is necessary to maintain the voltage across the drain-gate V2 equal to or lower than the gate oxide film breakdown voltage $V_C$, and to set the resistances R1 and R2 so that the following two conditions are satisfied.

(1) When the drain voltage V1 reaches the gate oxide film breakdown voltage $V_C$, the relation V2>$V_{BD}$ is maintained.

(2) When the drain voltage V1 reaches the turn-on voltage $V_{TO}$, the relation V2<$V_C$ is maintained.

Figure 10:
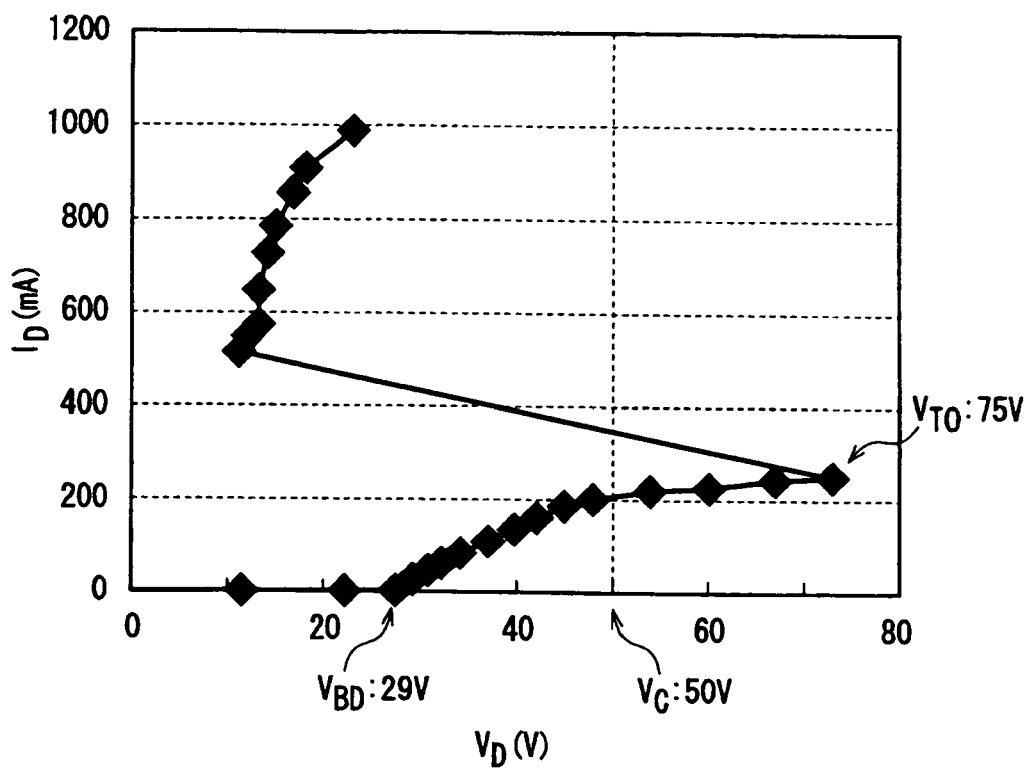
FIG. 10 illustrates a relation between the drain voltage and the drain current of the NMOS according to the high voltage process.

As an example, FIG. 10 illustrates a relation between the drain voltage and the drain current in the NMOS according to the high voltage process. The horizontal axis represents the drain voltage $V_D$, and the vertical axis represents the drain current $I_D$. Here, since the thickness of the silicon oxide film being the gate oxide film is set to 50 nm, the gate oxide film breakdown voltage $V_C$ is about 50 Volts. When the drain voltage $V_D$ rises to reach 29 Volts of the breakdown voltage $V_{BD}$, the drain current $I_D$ starts flowing. Since the turn-on voltage $V_{TO}$ of the parasitic bipolar transistor of the NMOS is 75 Volts, the drain voltage $V_D$ exceeds 50 Volts of the gate oxide film breakdown voltage $V_C$, while the parasitic bipolar transistor is not turned ON.

Here, assuming that the ratio of the resistances R1 and R2 of the NMOS 81 for protection and the resistor 95 is set to 3:2, which are used in the second electrostatic breakdown preventing protection circuit 32 of the first embodiment, when the drain voltage V1 reaches 50 Volts of the gate oxide film breakdown voltage $V_C$, the voltage across the drain-gate V2 is 30 Volts, the breakdown current flows through the NMOS 81 for protection steadily. Thereafter, when the drain voltage rises further, the voltage across the drain-gate V2 is suppressed to 60% of the drain voltage V1 owing to the NMOS 81 for protection and the resistor 95. When the drain voltage V1 reaches 75 Volts being the turn-on voltage $V_{TO}$ of the parasitic bipolar transistor, the voltage across the drain-gate V2 is 45 Volts. After the parasitic bipolar transistor is turned ON, the drain voltage V1 and the voltage across the drain-gate V2 sharply drop. In the circuit of FIG. 1, when a positive voltage having a magnitude equal to or higher than the gate oxide film breakdown voltage $V_C$ is inputted from the input terminal, the gate oxide films of the NMOS 61 and the NMOS 81 for protection are protected.

When the device receives the normal signal level (0~5 Volts) at the input circuit thereof, both the NMOS 61 and the NMOS 81 for protection are OFF, and the signal level is lower than the breakdown voltage of the PN junction; accordingly, the input protection circuit does not contribute to this condition.

Next, the operation when the device receives a negative electrostatic surge will be explained. At the time when the drain voltage V1 exceeds the forward voltage of the PN junction, a current flows into the drain-substrate. Accordingly, the voltages across the drain-gate and across the source-gate of the NMOS 61, and the voltages across the drain-gate and across the source-gate of the NMOS 81 for protection reach about the forward voltage $V_F$. Therefore, there does not occur a breakdown of the gate oxide film.

The operation of the first electrostatic breakdown preventing protection circuit 30 including the PMOS 51, PMOS 71 for protection, and the resistor 93 is basically the same as the operation of the second electrostatic breakdown preventing protection circuit 32 including the NMOS 61, NMOS 81 for protection, and the resistor 95, although the polarity is inverted.

Provided that a voltage of the normal signal level (0~5 Volts) is inputted to the input circuit 29 from the input terminal 21, both the PMOS 51 and the PMOS 71 for protection are OFF, and the signal level of the input circuit is lower than the voltage (for example, +12 Volts) of the power supply terminal 23; therefore, the protection circuit operates as a diode and does not give any influence to the input signal.

When the input voltage rises higher than the voltage of the power supply terminal 23, at the time when it exceeds the forward voltage of the PN junction, a current flows into the drain-substrate. Accordingly, the potential differences across the drain-gate and across the gate-source of the PMOS 51, and the potential differences across the drain-gate and across the gate-source of the PMOS 71 for protection reach about the forward voltage. Therefore, there does not occur a breakdown of the gate oxide film.

As the voltage inputted to the input terminal 21 gradually increases from the state of 0 Volt to the negative direction, the voltage across the drain-source (hereunder, referred to as drain voltage) V4 and the voltage across the drain-gate V5 of the PMOS 51 each increase to the negative direction. Since both the PMOS 51 and the PMOS 71 for protection are OFF, the drain voltage V4 is equal to the voltage across the drain-gate V5. Thereafter, at the moment when the drain voltage V4 reaches a breakdown voltage $V_{BD}$ of the PN junction across the drain-well of the PMOS 51, the PN junction across the drain-well of the PMOS 51 creates a breakdown to flow a breakdown current. And, since the voltage across the drain-gate V5 of the PMOS 51 corresponds to the voltage across the drain-well of the PMOS 71 for protection, the PN junction across the drain-well of the PMOS 71 for protection also creates a breakdown to flow a breakdown current. The breakdown current flowing through the PMOS 71 for protection flows through the resistor 93 into the power supply terminal 23. As the breakdown current flows through the PMOS 71 for protection and the resistor 93, there occurs a potential difference between both ends of the resistor 93; accordingly, the voltage across the drain-gate V5 of the PMOS 51 becomes lower by the potential difference than the drain voltage V4. As the voltage across the drain-gate V5 becomes equal to or lower than the breakdown voltage $V_{BD}$, the breakdown current stops flowing. In this manner, the PN junction across the drain-substrate of the PMOS 71 for protection becomes conductive intermittently, however as a whole, the voltage across the drain-gate V5 increases, bearing the same value as the drain voltage V2. Even if there occurs a voltage drop by the breakdown current flowing through the PMOS 71 for protection and the resistor 93, as the drain voltage V4 and the voltage across the drain-gate V5 reach a voltage just to maintain the relation V5>$V_{BD}$, the breakdown current flows through the PMOS 71 for protection steadily. Here, if the effective resistance of the PMOS 71 for protection is represented by R3(=ΔV/ΔI), and the resistance of the resistor 93 is represented by R4, the voltage across the drain-gate V5 of the PMOS 51 is given as follows.

$$V5=V4 \cdot R3/(R3+R4)$$

Hereafter, the voltage across the drain-gate V5 of the PMOS 51 is suppressed to a voltage determined by the ratio of the resistances R3 and R4. As the drain voltage V4 further increases to reach the turn-on voltage $V_{TO}$ of the bipolar transistor being parasitic on the PMOS 51, a through current flows into the drain-source of the PMOS 51 (collector-emitter of the parasitic bipolar transistor), and the drain voltage V4 sharply drops. The voltage across the drain-gate V5 of the PMOS 51 drops to follow the drain voltage V4.

Here, it is needed to set the ratio of the resistances R3 and R4 so as to satisfy the following two conditions, in the same manner as the ratio of the resistances R1 and R2.

(1a) When the drain voltage V4 reaches the gate oxide film breakdown voltage $V_C$, the relation V5>$V_{BD}$ is maintained.

(2a) When the drain voltage V4 reaches the turn-on voltage $V_{TO}$, the relation V5<$V_C$ is maintained.

With the above setting conditions satisfied, even if a negative voltage having a magnitude equal to or higher than the gate oxide film breakdown voltage $V_C$ of the PMOS 51 is also inputted from the input terminal, the gate oxide films of the PMOS 51 and the PMOS 71 for protection are protected.

(Effects of the First Embodiment)

With regard to the NMOS 61 that is likely to create a breakdown of the gate oxide film against a positive electrostatic surge, if the drain voltage V1 increases to a level that exceeds the gate oxide film breakdown voltage $V_C$, since the potential of the gate can be suppressed to a potential lower than the gate oxide film breakdown voltage $V_C$ owing to the function of the NMOS 81 for protection and the resistor 95, the gate oxide film will not be broken down. In the same manner, with regard to the PMOS 51 that is likely to create a breakdown of the gate oxide film against a negative electrostatic surge, if the absolute value of the drain voltage V4 increases to a level that exceeds the gate oxide film breakdown voltage $V_C$, since the potential of the gate can be suppressed to a potential lower than the gate oxide film breakdown voltage $V_C$ owing to the function of the PMOS 71 for protection and the resistor 93, the gate oxide film will not be broken down.

As to the PMOS 71 for protection and the resistor 93, and the NMOS 81 for protection and the resistor 95, it is only needed to adjust the ratios of the resistances, and the voltage control circuit can be designed in a very small area, so that there arises a slight increase in the occupancy area of the protection circuit. And, since the protection circuit only uses MOSFETs and resistors of the same structure as the conventional, it does not involve any additions to the manufacturing process. For example, if the gate width of the NMOS transistor being a protective object is assumed about 100~300 μm, it is only needed to use the gate width of about 10 μm in the NMOS 81 for protection, and the resistor width of about 5 μm in the protection resistor 95. Therefore, the increase of the occupancy area can be restrained to some % to ten and some few %, including the increase of the wiring area.

When the electrostatic breakdown preventing protection circuit of this invention is formed into a semiconductor integrated circuit using the MOS (Metal, Oxide film, and Semiconductor) structure, integrally with the devices including the input circuit being the circuit to be protected, it can be implemented as a semiconductor device of one unit, however the electrostatic breakdown preventing protection circuit may be formed into a separate unit.

(Construction of the Second Embodiment)

Figure 4:
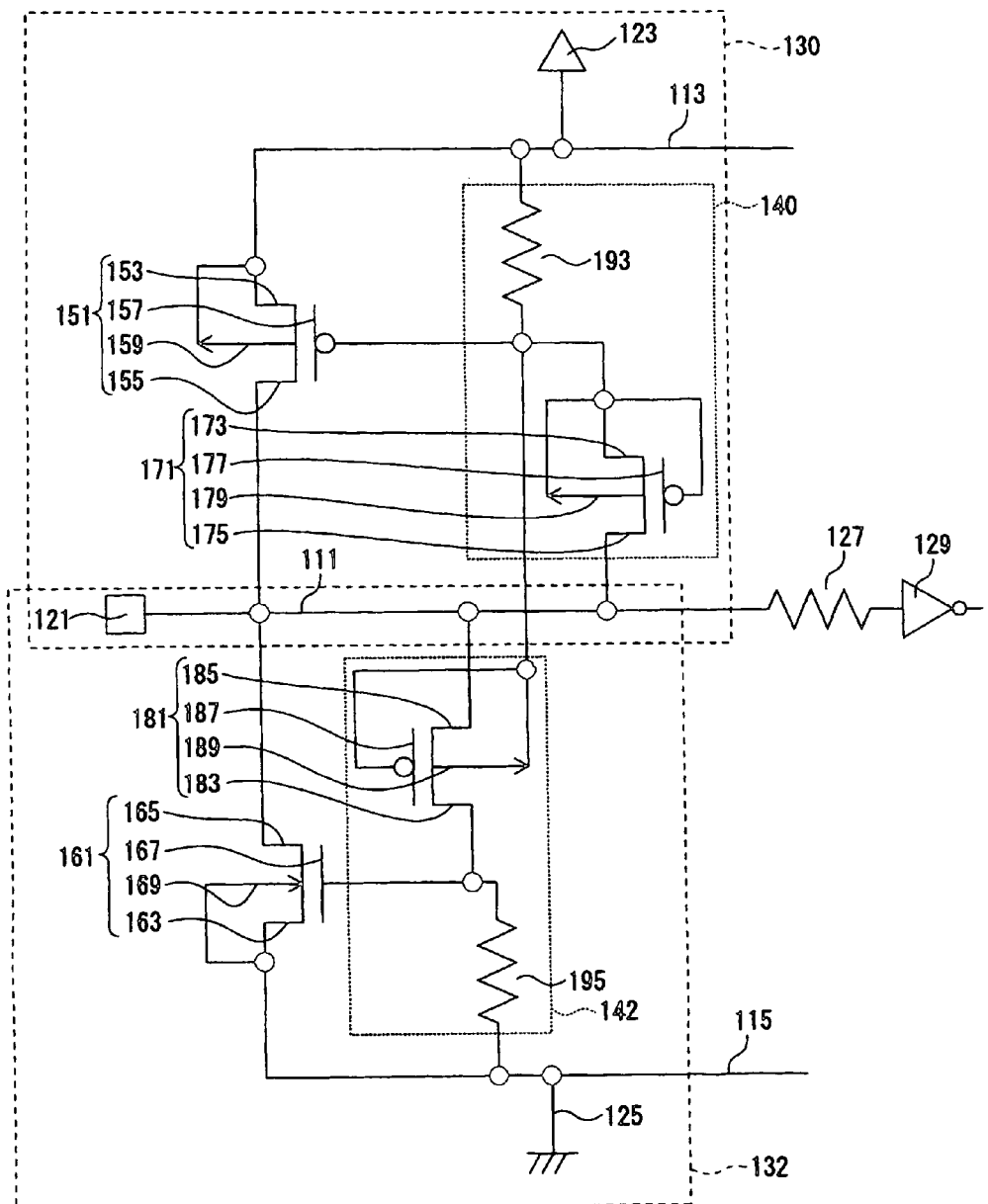
FIG. 4 illustrates a semiconductor device of the second embodiment.

The semiconductor device of the second embodiment provided with the electrostatic breakdown preventing protection circuit of the invention will be described with reference to FIG. 4. FIG. 4 is a circuit diagram illustrating the semiconductor device of the second embodiment. Here, it is assumed that an NMOS has an N-type source and drain formed on a P-type substrate, and a PMOS has an N-type well formed on the P-type substrate, and a P-type source and drain formed on the N-type well.

An input terminal 121 is electrically connected to an input circuit 129 being a protective object, by way of an input line 111 furnished with an input protection resistor 127. Here, an inverter is used as the input circuit 129. A power supply line 113 is connected to a power supply terminal 123, and a grounding line 115 is connected to a grounding terminal 125.

This semiconductor device includes two electrostatic breakdown preventing protection circuits, namely, a first electrostatic breakdown preventing protection circuit 130 made up of the input terminal 121 and the power supply terminal 123 as the first power supply terminal, and a second electrostatic breakdown preventing protection circuit 132 made up of the input terminal 121 and the grounding terminal 125 as the first power supply terminal.

Here, the input protection resistor 127 and the input circuit 129 can be realized with well-known resistor elements and circuit constructions, and the description thereof will be omitted.

The first electrostatic breakdown preventing protection circuit 130 includes a first MOSFET and a voltage control circuit 140. Between the input line 111 and the power supply line 113 is located a PMOS 151 as the first MOSFET. A drain electrode 155 of the PMOS 151 is connected to the input line 111. A source electrode 153 and a well electrode 159 of the PMOS 151 are connected to the power supply line 113. In order to protect the gate oxide film of the PMOS 151 from an electrostatic breakdown, the voltage control circuit 140 for controlling the potential of a gate electrode 157 of the PMOS 151 is inserted between the input line 111 and the power supply line 113. The voltage control circuit 140 is connected to bridge the drain and source of the PMOS 151, and is formed with the series connection of a first protection element and a second protection element. The gate electrode 157 of the PMOS 151 is connected to a node connecting the first protection element and the second protection element. Thereby, the gate electrode 157 of the PMOS 151 is given a potential divided by the ratio of the resistive components of the first protection element and the second protection element. Here, as the first protection element is used a PMOS 171 for protection, and as the second protection element is used a resistor 193.

The gate electrode 157 of the PMOS 151 is connected to the power supply line 113 through the resistor 193. A drain electrode 175 of the PMOS 171 for protection is connected to the input line 111. A source electrode 173, a gate electrode 177, and a well electrode 179 of the PMOS 171 for protection are connected to the gate electrode 157 of the PMOS 151.

The second electrostatic breakdown preventing protection circuit 132 includes the first MOSFET and a voltage control circuit 142. Between the input line 111 and the grounding line 115 is located an NMOS 161 as the first MOSFET. A drain electrode 165 of the NMOS 161 is connected to the input line 111. A source electrode 163 and a substrate electrode 169 of the NMOS 161 are connected to the grounding line 115. In order to protect the gate oxide film of the NMOS 161 from an electrostatic breakdown, the voltage control circuit 142 for controlling the potential of a gate electrode 167 of the NMOS 161 is inserted between the input line 111 and the grounding line 115. The voltage control circuit 142 is connected to bridge the drain and source of the NMOS 161, and is formed with the series connection of a first protection element and a second protection element. The gate electrode 167 of the NMOS 161 is connected to a node connecting the first protection element and the second protection element. Thereby, the gate electrode 167 of the NMOS 161 is given a potential divided by the ratio of the resistive components of the first protection element and the second protection element. Here, as the first protection element is used a PMOS 181 for protection, and as the second protection element is used a resistor 195.

The gate electrode 167 of the NMOS 161 is connected to the grounding line 115 through the resistor 195. A drain electrode 185 of the PMOS 181 for protection is connected to the input line 111. A source electrode 183 of the PMOS 181 for protection is connected to the gate electrode 167 of the NMOS 161. A gate electrode 187 and a well electrode 189 of the PMOS 181 for protection are connected to the power supply line 113 as the second power supply line through the resistor 193.

Although the MOSFET is used as the first protection element, and the resistive element is used as the second protection element in this case, the first MOSFET may be combined with an element capable of giving a voltage corresponding to a setting. Since the first protection element is needed to be OFF to the voltage of the normal signal level, it can be realized by a diode, for example. Since the second protection element only needs to give a resistance, the resistance of a FET being forced to always be ON, for example, may be used.

(Operation of the Second Embodiment)

The operation of the second embodiment will be described with reference to FIG. 5 and FIG. 6. The operation of the circuit made up of the PMOS 151, PMOS 171, and resistor 193 is the same as that of the circuit made up of the PMOS 51, PMOS 71, and resistor 93, aas explained with reference to the fist embodiment, and hence the description thereof will be omitted.

Figure 5:
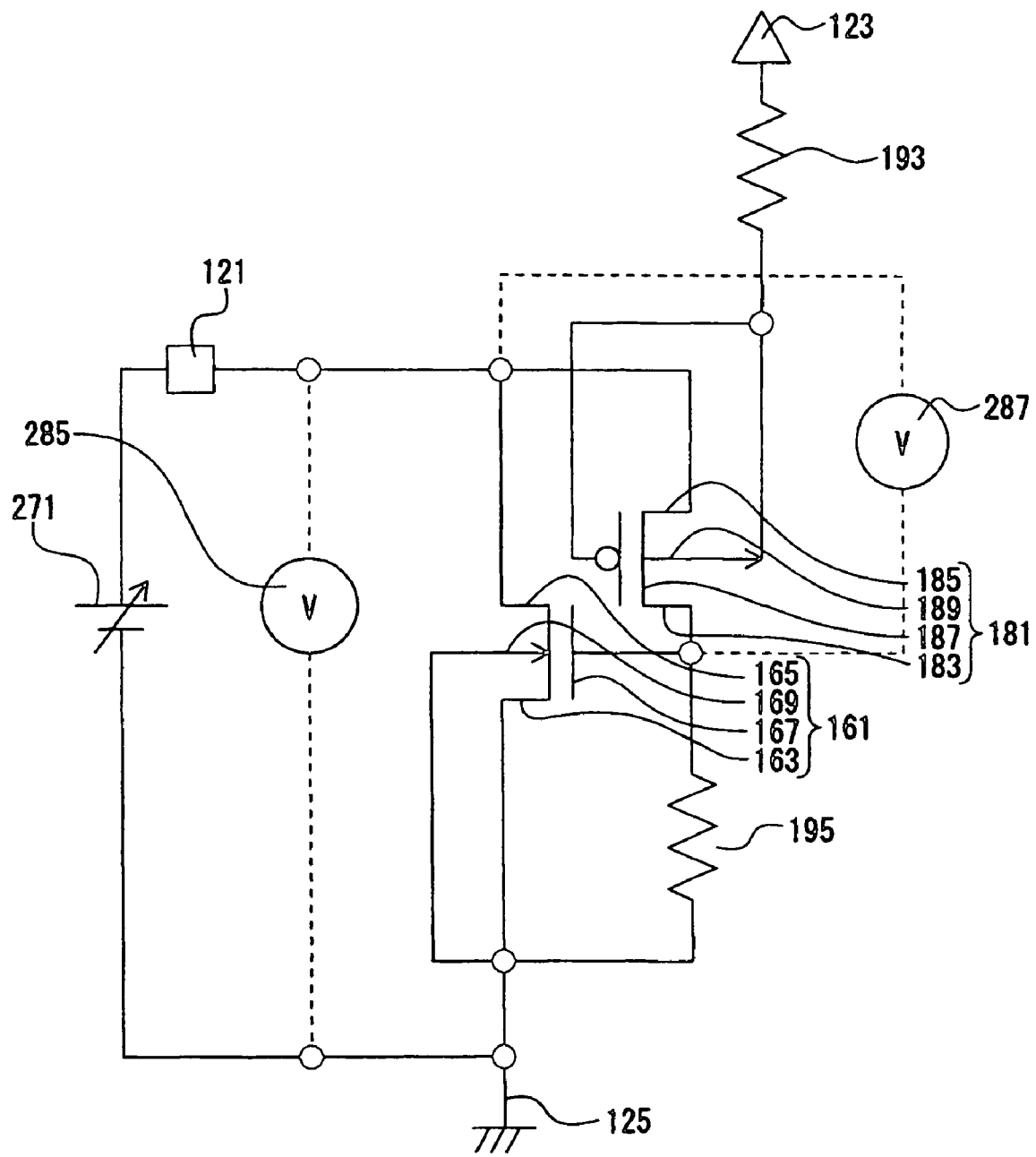
FIG. 5 illustrates a circuit for measuring the characteristic of the semiconductor device of the second embodiment.

FIG. 5 is a circuit diagram explaining a circuit for measuring the characteristic of the second electrostatic breakdown preventing protection circuit 132. A variable voltage supply 271 is provided to bridge the input terminal 121 and the grounding terminal 125, thus applying a voltage to the input terminal 121. Here, the first voltmeter 285 measures a voltage across the drain-source (hereunder, referred to as drain voltage) V11 of the NMOS 161, and the second voltmeter 287 measures a voltage across the drain-gate V12 of the NMOS 161.

Figure 6:
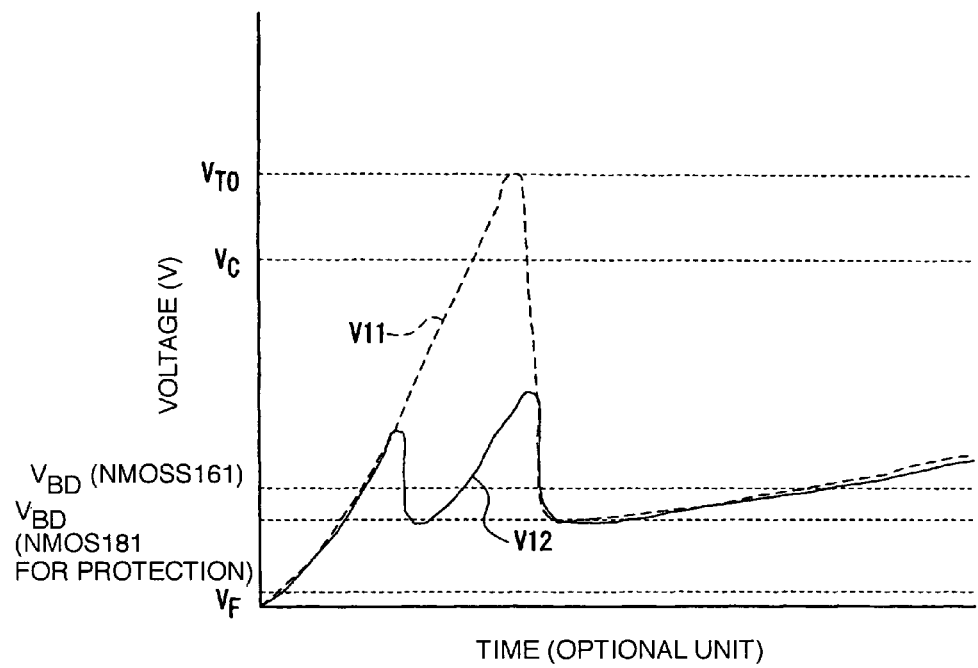
FIG. 6 illustrates a relation between the drain voltage and the voltage across the drain-gate of the second embodiment.
Figure 7:
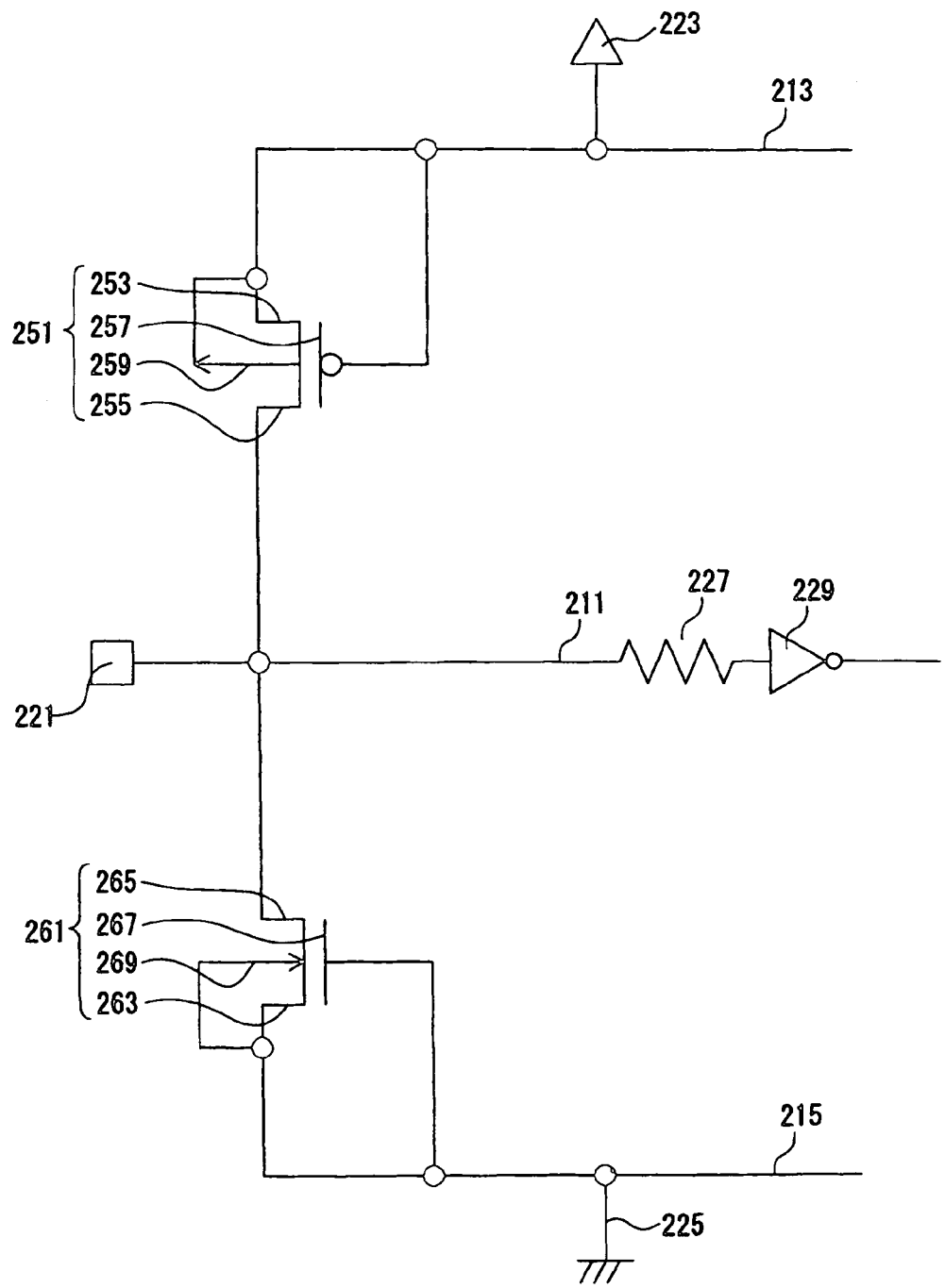
FIG. 7 illustrates a conventional semiconductor device.
Figure 8:
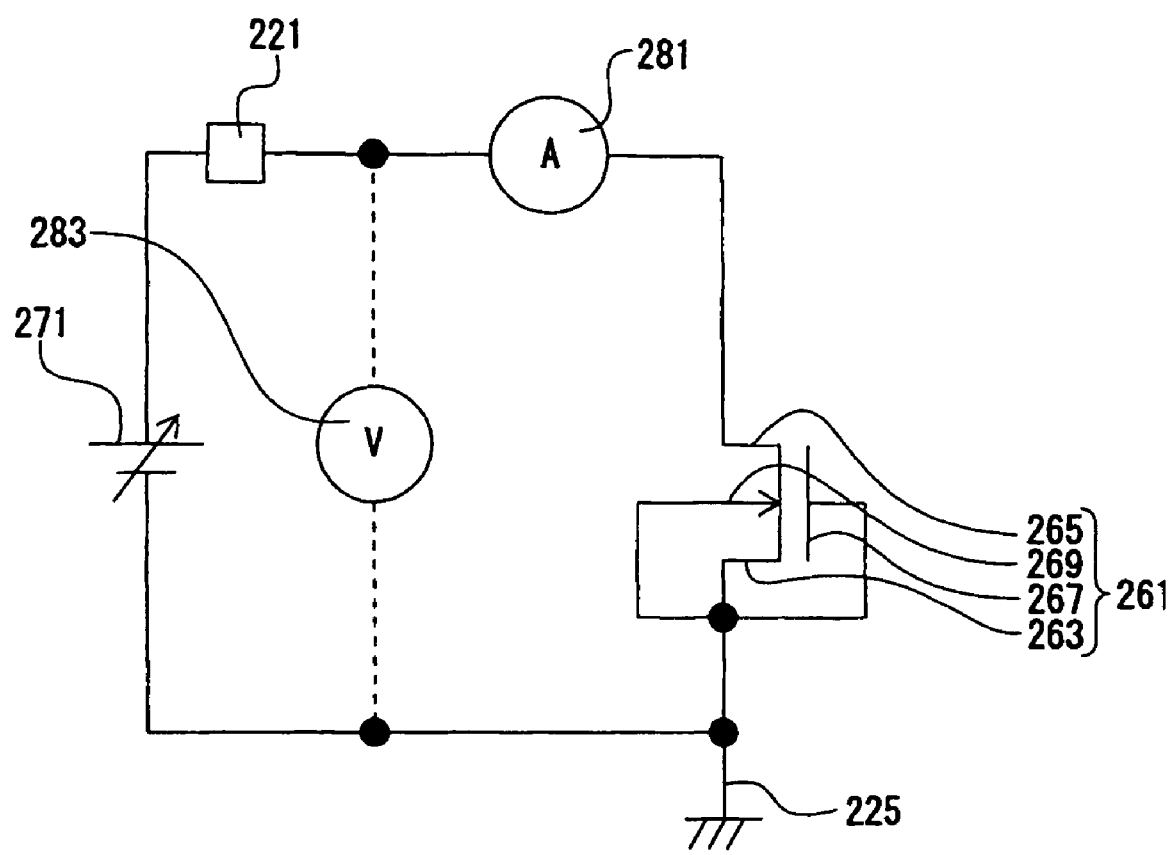
FIG. 8 illustrates a circuit for measuring the characteristic of the semiconductor device in the related art.
Figure 9:
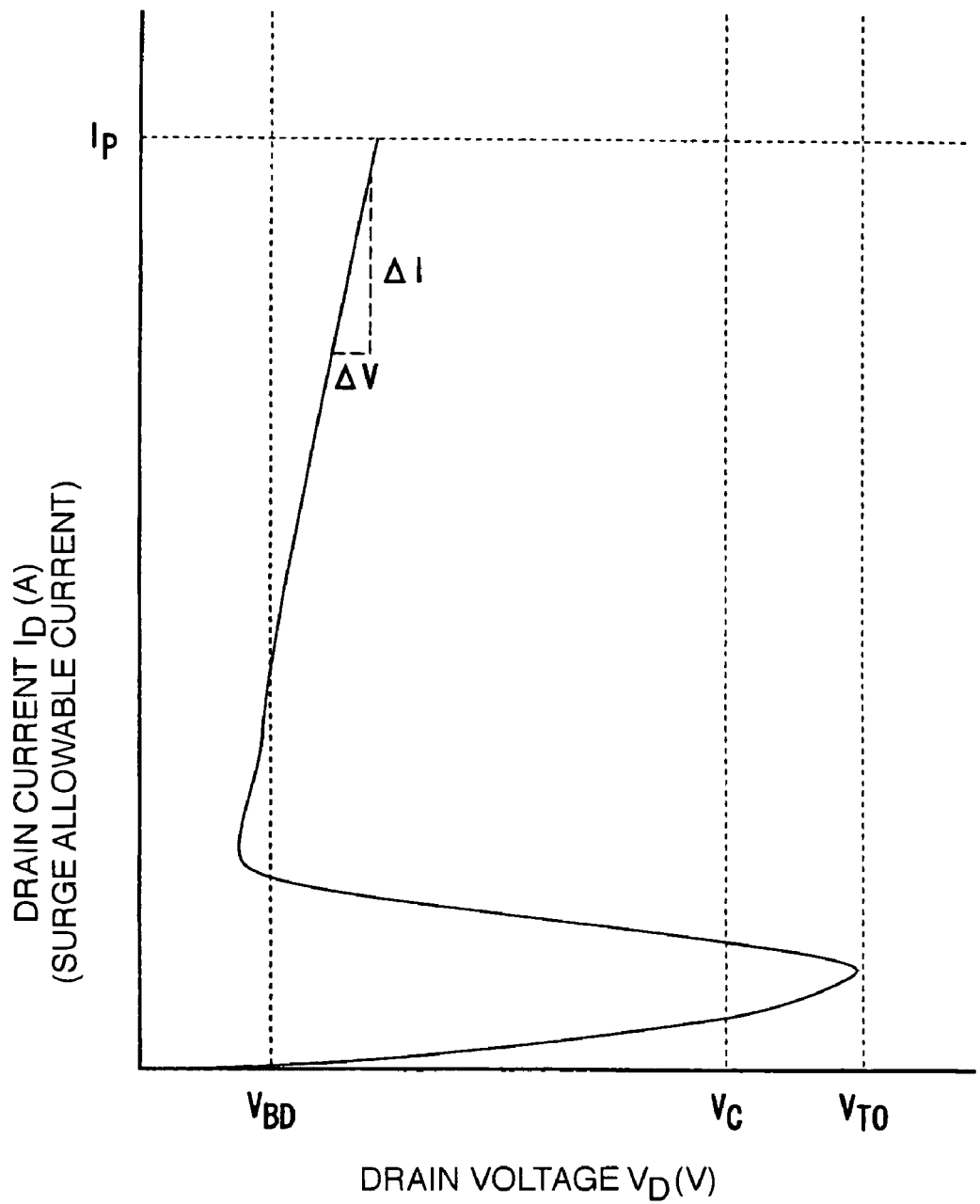
FIG. 9 illustrates a relation between the drain voltage and the drain current.

FIG. 6 illustrates a variation of the drain voltage V11 and the voltage across the drain-gate V12 of the NMOS 161, by the circuit explained with reference to FIG. 5. The horizontal axis represents the time, and the vertical axis represents the voltage.

As the output voltage of the variable voltage supply 271 gradually increases from the state of 0 Volt, the drain voltage V11 and the voltage across the drain-gate V12 each increase. Here, since both the NMOS 161 and the NMOS 181 for protection are OFF, the drain voltage V11 is equal to the voltage across the drain-gate V12. As the drain voltage V11 and the voltage across the drain-gate V12 reach the forward voltage $V_F$ of the PN junction, the well potential rises to follow the drain voltage V11. Thereafter, at the moment that the drain voltage V11 reaches the breakdown voltage $V_{BD}$ of the PN junction of the PMOS 181 for protection, the PN junction of the PMOS 181 for protection creates a breakdown to flow a breakdown current. The breakdown current flowing through the PMOS 181 for protection flows through the resistor 195 into the grounding terminal 125. As the breakdown current flows through the PMOS 181 for protection and the resistor 195, there occurs a potential difference between both ends of the resistor 195; accordingly, the voltage across the drain-gate V12 of the NMOS 161 becomes lower by the potential difference than the drain voltage V11. As the voltage across the drain-gate V12 becomes equal to or lower than the breakdown voltage $V_{BD}$, the breakdown current stops flowing. Accordingly, the PN junction across the drain-well of the PMOS 181 for protection becomes conductive intermittently, however as a whole, the voltage across the drain-gate V12 increases, bearing the same value as the drain voltage V11.

Even if there occurs a voltage drop by the breakdown current flowing through the PMOS 181 for protection and the resistor 195, as the drain voltage V11 and the voltage across the drain-gate V12 reach a voltage just to maintain V12>V$_{BD}$, the breakdown current flows through the PMOS 181 for protection steadily. Here, if the effective resistance of the PMOS 181 for protection is represented by R11 (=ΔV/ΔI), and the resistance of the resistor 195 is represented by R12, the voltage across the drain-gate V12 of the NMOS 161 is given as follows.

$$V12=V11 \cdot R11/(R11+R12)$$

Hereafter, the voltage across the drain-gate V12 of the NMOS 161 is suppressed to a voltage determined by the ratio of the resistances R11 and R12. As the drain voltage V11 further increases to reach the turn-on voltage V$_{TO}$ of the bipolar transistor being parasitic on the NMOS 161, a through current flows into the drain-source of the NMOS 161 (collector-emitter of the parasitic bipolar transistor), and the drain voltage V11 sharply drops. The voltage across the drain-gate V12 of the NMOS 161 drops to follow the drain voltage V11.

Practically, the ratio of the resistances R11 and R12 is determined by the three values of the breakdown voltage V$_{BD}$, the gate oxide film breakdown voltage V$_C$, and the turn-on voltage V$_{TO}$ of the bipolar transistor being parasitic on the NMOS 161. In order to prevent a breakdown of the gate oxide film, it is necessary to maintain the voltage across the drain-gate V12 equal to or lower than the gate oxide film breakdown voltage V$_C$, and to set the resistances R11 and R12 so that the following two conditions are satisfied.

(1b) When the drain voltage V11 reaches the gate oxide film breakdown voltage V$_C$, the relation V12>V$_{BD}$ is maintained.

(2b) When the drain voltage V11 reaches the turn-on voltage V$_{TO}$, the relation V12<V$_C$ is maintained.

When the device receives the normal signal level (0~5 Volts) at the input circuit thereof, both the NMOS 161 and the PMOS 181 for protection are OFF, and the signal level is lower than the breakdown voltage of the PN junction; accordingly, the input protection circuit does not contribute to this condition.

Next, the operation when the device receives a negative electrostatic surge will be explained. At the time when the drain voltage V11 exceeds the forward voltage of the PN junction, a current flows into the drain-substrate of the NMOS 161. Accordingly, the voltages across the drain-gate and across the source-gate of the NMOS 161, and the voltages across the drain-gate and across the source-gate of the PMOS 181 for protection reach about the forward voltage V$_F$. Therefore, there does not occur a breakdown of the gate oxide film.

(Effects of the Second Embodiment)

With regard to the NMOS 161 that is likely to create a breakdown of the gate oxide film against a positive electrostatic surge, if the drain voltage V11 increases to a level that exceeds the gate oxide film breakdown voltage V$_C$, since the potential of the gate can be suppressed to a potential lower than the gate oxide film breakdown voltage V$_C$ owing to the function of the PMOS 181 for protection and the resistor 195, the gate oxide film will not be broken down.

Since the PMOS 181 for protection is employed, the protection circuit is effective especially when the sum of the forward voltage of the PN junction of the PMOS 181 for protection and the breakdown voltage of the PMOS 181 for protection is lower than the breakdown voltage of the NMOS 161. That is, since the circuit on the protecting side against an electrostatic surge is designed to operate at a lower voltage than the transistor on the protected side, the protection circuit is able to protect the gate oxide film more securely.

As to the PMOS 171 for protection and the resistor 193, and the PMOS 181 for protection and the resistor 195, it is only needed to adjust the ratios of the resistances, and they can be designed in a very small area, so that there arises a slight increase in the occupancy area of the protection circuit. And, since the protection circuit only uses FETs and resistors of the same structure as the conventional, it does not involve any additions to the manufacturing process. In addition, when the electrostatic breakdown preventing protection circuit of this invention is formed into a semiconductor integrated circuit using the MOS structure, integrally with the devices including the input circuit being the circuit to be protected, it can be implemented as a semiconductor device of one unit, however the electrostatic breakdown preventing protection circuit may be formed into a separate unit.

What is claimed is:

1. An electrostatic breakdown preventing protection circuit that prevents an electrostatic breakdown of a circuit to be protected, wherein the electrostatic breakdown preventing protection circuit comprises:
    an input terminal through which an external circuit is connected to the circuit to be protected,
    a first power supply terminal,
    a first MOSFET having a drain electrode that is connected to the input terminal and the circuit to be protected, and having a source electrode and a substrate or well electrode that are connected to the first power supply terminal, and
    a voltage control circuit that is connected to bridge the drain electrode and the source electrode of the first MOSFET, which controls a voltage of the gate electrode of the first MOSFET to prevent an electrostatic breakdown of the first MOSFET;
    wherein the voltage control circuit comprises a first protection element, the first protection element comprising an FET of the same conduction polarity as the first MOSFET,
    wherein a drain electrode of the first protection element is connected to the drain electrode of the first MOSFET, and
    a source electrode, gate electrode, and substrate electrode of the first protection element are connected to the gate electrode of the first MOSFET.

2. The electrostatic breakdown preventing protection circuit as claimed in claim 1, wherein:
    the voltage control circuit is formed with a series circuit of the first protection element and a second protection element for dividing the voltage across the drain-source of the first MOSFET, and
    a node connecting the first protection element and the second is connected to the gate electrode of the first MOSFET.

3. The electrostatic breakdown preventing protection circuit as claimed in claim 2, wherein:
    the first MOSFET is a P-type MOSFET,
    the first protection element is a P-type MOSFET, and
    the second protection element is a resistor.

4. The electrostatic breakdown preventing protection circuit as claimed in claim 2, wherein:
    the first MOSFET is an N-type MOSFET, the first protection element is an N-type MOSFET, and the second protection element is a resistor.

5. An electrostatic breakdown preventing protection circuit that prevents an electrostatic breakdown of a circuit to be protected, wherein the electrostatic breakdown preventing protection circuit comprises:

an input terminal through which an external circuit is connected to the circuit to be protected, a first power supply terminal, a first MOSFET of which a drain electrode is connected to the input terminal and the circuit to be protected, of which drain and substrate electrodes are connected to the first power supply terminal, and a voltage control circuit that is connected to bridge the drain electrode and a source electrode of the first MOSFET, which controls a voltage of a gate electrode of the first MOSFET to prevent an electrostatic breakdown of the first MOSFET, wherein:

the voltage control circuit is formed with a series circuit of a first protection element and a second protection element for dividing the voltage across the drain and source electrodes of the first MOSFET, and a node connecting the first protection element and the second protection element is connected to the gate electrode of the first MOSFET, further comprising a second power supply terminal, wherein:

the first MOSFET is an N-type MOSFET, the first protection element is a P-type MOSFET, the second protection element is a first resistor, the drain electrode of the first protection element is connected to the drain electrode of the first MOSFET, the source electrode of the first protection element is connected to the gate electrode of the first MOSFET, and the gate electrode and well electrode of the first protection element are connected to the second power supply terminal through a second resistor.

6. An electrostatic breakdown preventing protection circuit that prevents an electrostatic breakdown of a circuit to be protected, wherein the electrostatic breakdown preventing protection circuit comprises:

an input terminal through which an external circuit is connected to the circuit to be protected, a first power supply terminal, a first MOSFET of which a drain electrode is connected to the input terminal and the circuit to be protected, of which source and substrate electrodes are connected to the first power supply terminal, and a voltage control circuit that is connected to bridge the drain electrode and the source electrode of the first MOSFET, which controls a voltage of the gate electrode of the first MOSFET to prevent an electrostatic breakdown of the first MOSFET, wherein:

the voltage control circuit is formed with a series circuit of a first protection element and a second protection element for dividing the voltage across the drain-source of the first MOSFET, and a node connecting the first protection element and the second protection element is connected to the gate electrode of the first MOSFET, further comprising a second power supply terminal, wherein:

the first MOSFET is an P-type MOSFET, the first protection element is a P-type MOSFET, the second protection element is a resistor, the drain electrode of the first protection element is connected to the drain electrode of the first MOSFET, the source electrode of the first protection element is connected to the gate electrode of the first MOSFET, and the gate electrode and well electrode of the first protection element are connected to the first power supply terminal through the resistor.

* * * * *